United States Patent [19]

Bond et al.

[11] Patent Number: 4,915,565

[45] Date of Patent: Apr. 10, 1990

[54] MANIPULATION AND HANDLING OF INTEGRATED CIRCUIT DICE

[75] Inventors: Robert H. Bond, Carrollton; Steven Swendrowski, The Colony; Michael A. Olla, Flower Mound; Barry L. Morrison, Bedford, all of Tex.

[73] Assignee: SGS-Thomson Microelectronics, Inc., Carrollton, Tex.

[21] Appl. No.: 325,014

[22] Filed: Mar. 16, 1989

Related U.S. Application Data

[60] Continuation of Ser. No. 917,003, Oct. 9, 1986, abandoned, which is a division of Ser. No. 592,151, Mar. 22, 1984, Pat. No. 4,626,167.

[51] Int. Cl.⁴ .............................................. B65G 65/00
[52] U.S. Cl. .................................. 414/225; 29/740; 29/759; 74/55; 156/567; 156/584; 221/74; 414/417
[58] Field of Search ............... 414/222, 225, 786, 405, 414/417; 29/759, 740, 741, ; 221/74; 156/249, 541, 542, 567, 584; 74/55

[56] References Cited

U.S. PATENT DOCUMENTS

| 4,372,802 | 2/1983 | Harigane et al. ............... 414/226 X |
| 4,494,902 | 1/1985 | Kuppens et al. ............... 414/226 X |
| 4,759,675 | 7/1988 | Bond et al. ..................... 414/417 X |

FOREIGN PATENT DOCUMENTS 562884 6/1977 U.S.S.R. ............................. 414/222

Primary Examiner—Robert J. Spar
Assistant Examiner—Donald W. Underwood
Attorney, Agent, or Firm—Kenneth C. Hill; Richard K. Robinson

[57] ABSTRACT

An apparatus for inverting and handling integrated circuit dice employs rotating apparatus for rotating a chip carrier by 180 degrees to invert and transfer dice from one set of receptacles to another; together with an apparatus for precisely aligning dice resting at random positions within a set of oversized receptacles.

5 Claims, 13 Drawing Sheets

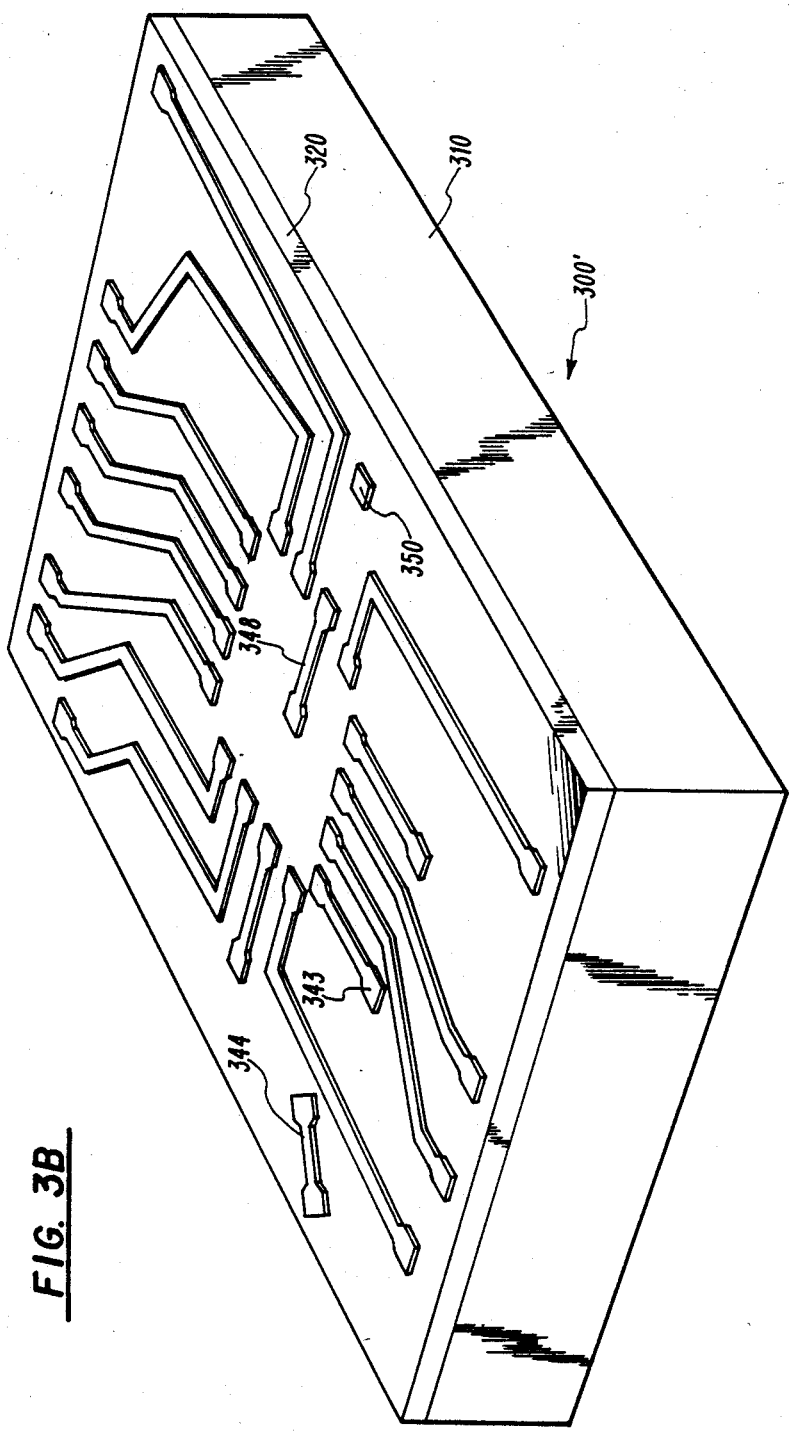

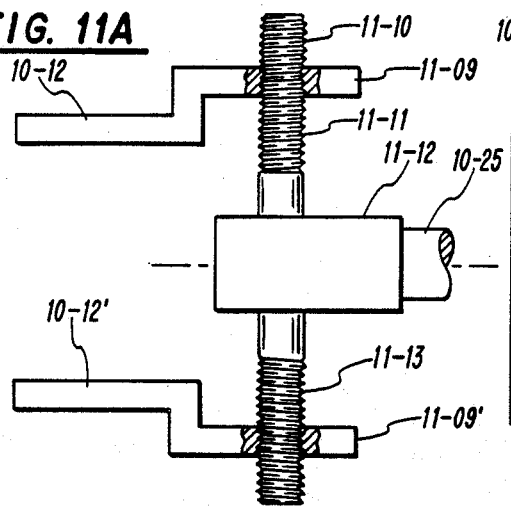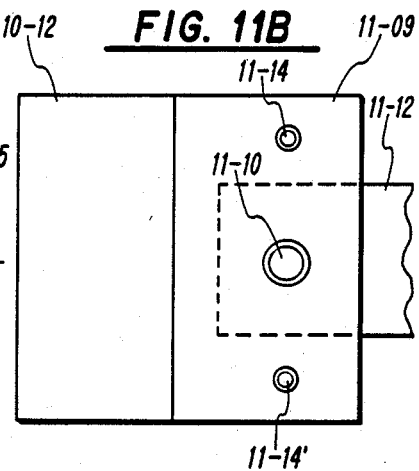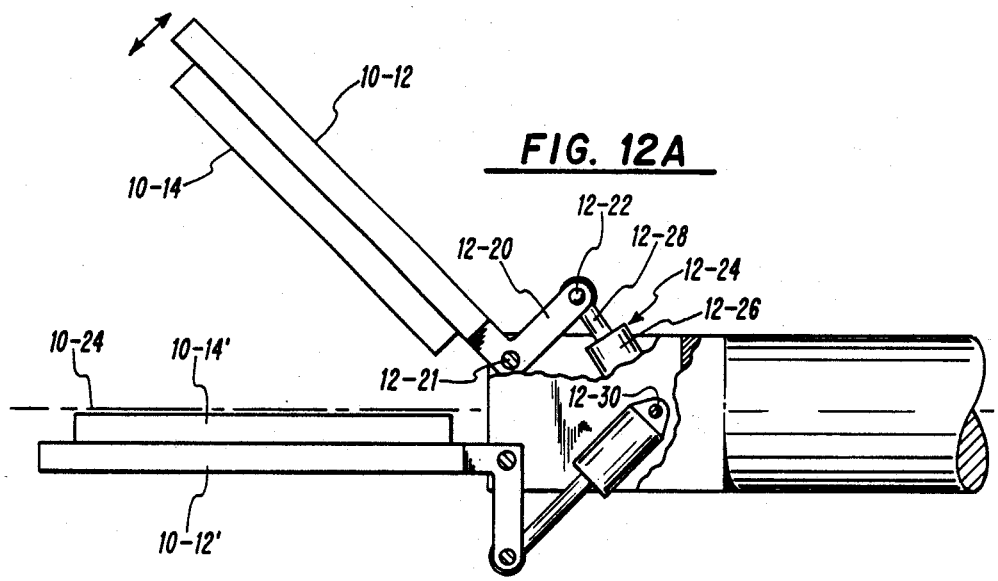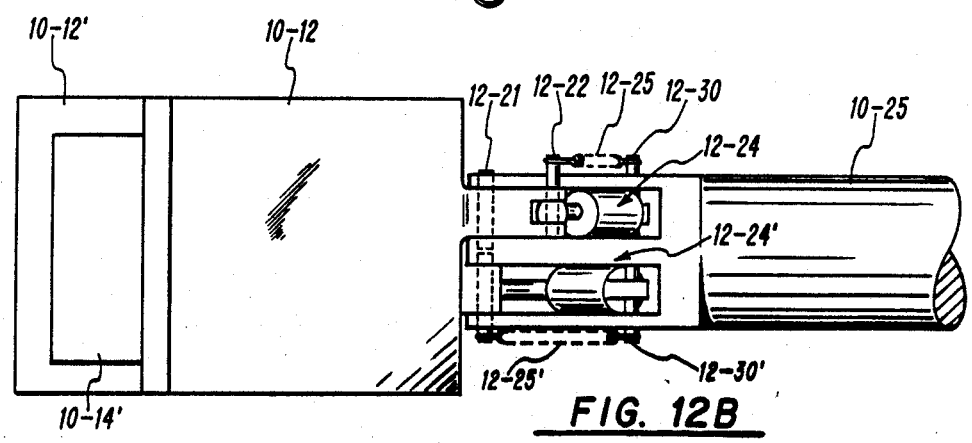

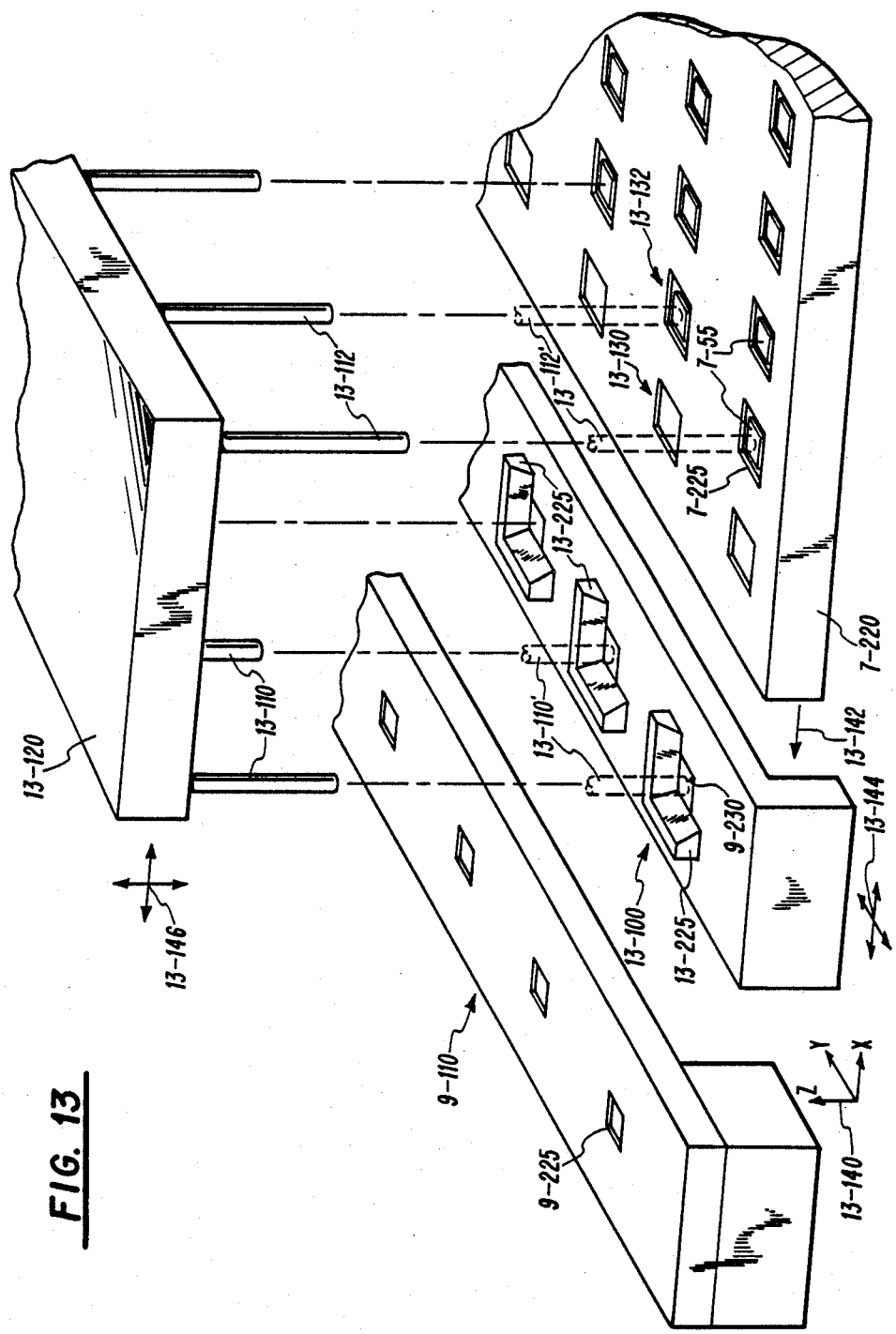

MANIPULATION AND HANDLING OF INTEGRATED CIRCUIT DICE

This application is a continuation, of application Ser. No. 06/917,003, filed Oct. 9, 1986, abandoned, which is a division of Ser. No. 06/592,151, filed 3-22-84, now U.S. Pat. No. 4,626,167.

TECHNICAL FIELD

The field of the invention is that of assembly and packaging of integrated circuit chips, in particular by means of automated machinery.

BACKGROUND ART

The standard method of handling integrated circuit chips in the art is to cut the chips apart from the wafer; pick the separated chips up by a vacuum gripper that is manipulated by hand; then manually place the chips one-by-one in position for the wire bonding step. At this time defective chips are sorted manually by means of a conventional ink-dot marking method.

DISCLOSURE OF INVENTION

The invention relates to an automatic high speed method of inverting one or more integrated circuit chips and transferring the inverted chips to a holder for further processing.

A feature of the invention is the solution of the problem of adapting the chip manipulation method to automated processing.

A feature of the invention is a sorting method adapted to parallel handling of sets of chips that fit in with an integrated system.

BRIEF DESCRIPTION OF DRAWINGS

FIGS. 3A and 3B illustrate different forms of a chip used in the subject invention.

FIGS. 11A and 11B illustrate an alternate embodiment of part of the apparatus of FIG. 10.

FIGS. 12A and 12B illustrate an alternate embodiment of part of the apparatus of FIG. 10.

FIG. 13 illustrates a transfer apparatus for moving a set of dice in parallel.

BEST MODE FOR CARRYING OUT THE INVENTION

In order to understand completely the context of the invention that is the subject of this application, a description of the overall system of which it is a part is included. Details pertinent to this invention will be found in the section labelled inversion and transfer.

Figure 1:
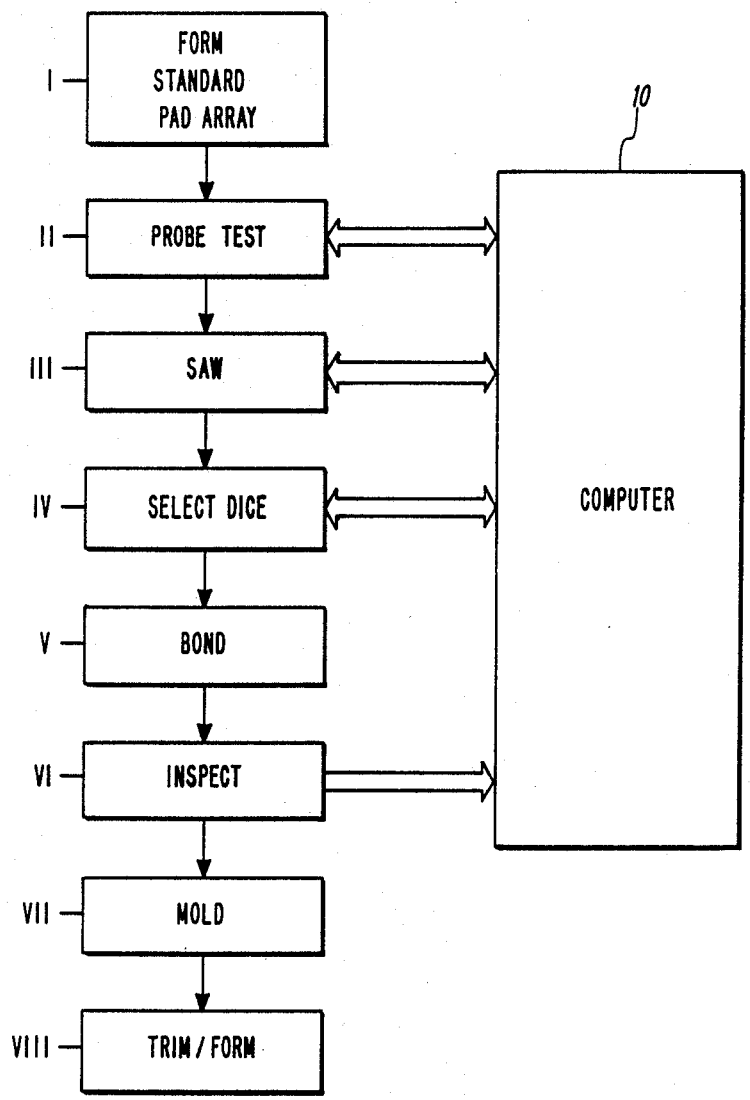
FIG. 1 illustrates the process flow in the subject invention.

An overall flow chart of the steps used in the back-end assembly is illustrated in FIG. 1, in which a number of steps are illustrated schematically and are performed by a variety of different machines in communication with and sometimes controlled by a computer for storing test and other data.

In the first major step, represented by the box labelled I, a process that may be part of the "front-end" or the "back-end", accepts as input a wafer that has been completed with all the conventional steps (including passivation, etc.) and applies a further layer of dielectric having a thickness sufficient to protect the chip circuits and to insulate them electrically from signals being carried on the top surface of the dielectric.

A pattern of metal leads is formed that extends from the contact pads on the previous chip to a standard array of contact pads on the top of the dielectric. The standard array is the same for all chips having the same number of pins, regardless of the size of the chip die.

The wafer is then probe tested, in major step II with the results of the probe test being stored electrically, such as in a computer. The conventional ink-dot marking system for bad chips is not used.

The wafer is then adhesively mounted on an adhesive film in a frame holder that is shaped to allow for automatic insertion and orientation in various fixtures further along in the process and cut apart in an automatic sawing process (Step III) that cuts through the entire thickness of the wafer.

The good dice are then removed from the wafer in an automatic sequence (Step IV) that presses from above against the tape to selectively pick a die down into a dedicated carrier where it rests circuit side down. This is not a problem since the active circuitry is protected by the standard pad dielectric and standard pads. The wafer and punch-out device are moved under computer control to put the dice into the correct positions in the carrier.

The dice are transferred to a mating carrier simultaneously in an inversion operating that rotates the two-carrier "sandwich" by 180 degrees, so that the dice resting in the second carrier have contacts on the top side. A set of dice are transferred to a bonding fixture that holds a convenient number, illustratively 14 dice. Once loading is complete, a leadframe matching the spacing of the dice in the fixture is positioned above the dice in the soldering fixture and an upper bonding fixture is added to maintain lead to pad contact during the bonding process.

The bonding fixture is heated to reflow the solder and form the interconnection (Step V).

The leadframe with dice attached is placed in a transfer or injection molding machine that encapsulates the die together with the interconnections to the leadframe (Step VI).

The molded strip of devices is then trimmed and formed conventionally (Step VII).

There is a representation in FIG. 1 of data communication between the machines that perform the steps listed above and the controlling computer. Most data communication steps are optional. The step may indeed be performed under operator control and data may be written down manually. The benefits of automatic recording of data and error-free recall of data from a previous step will be evident to those skilled in the art.

Figure 2:
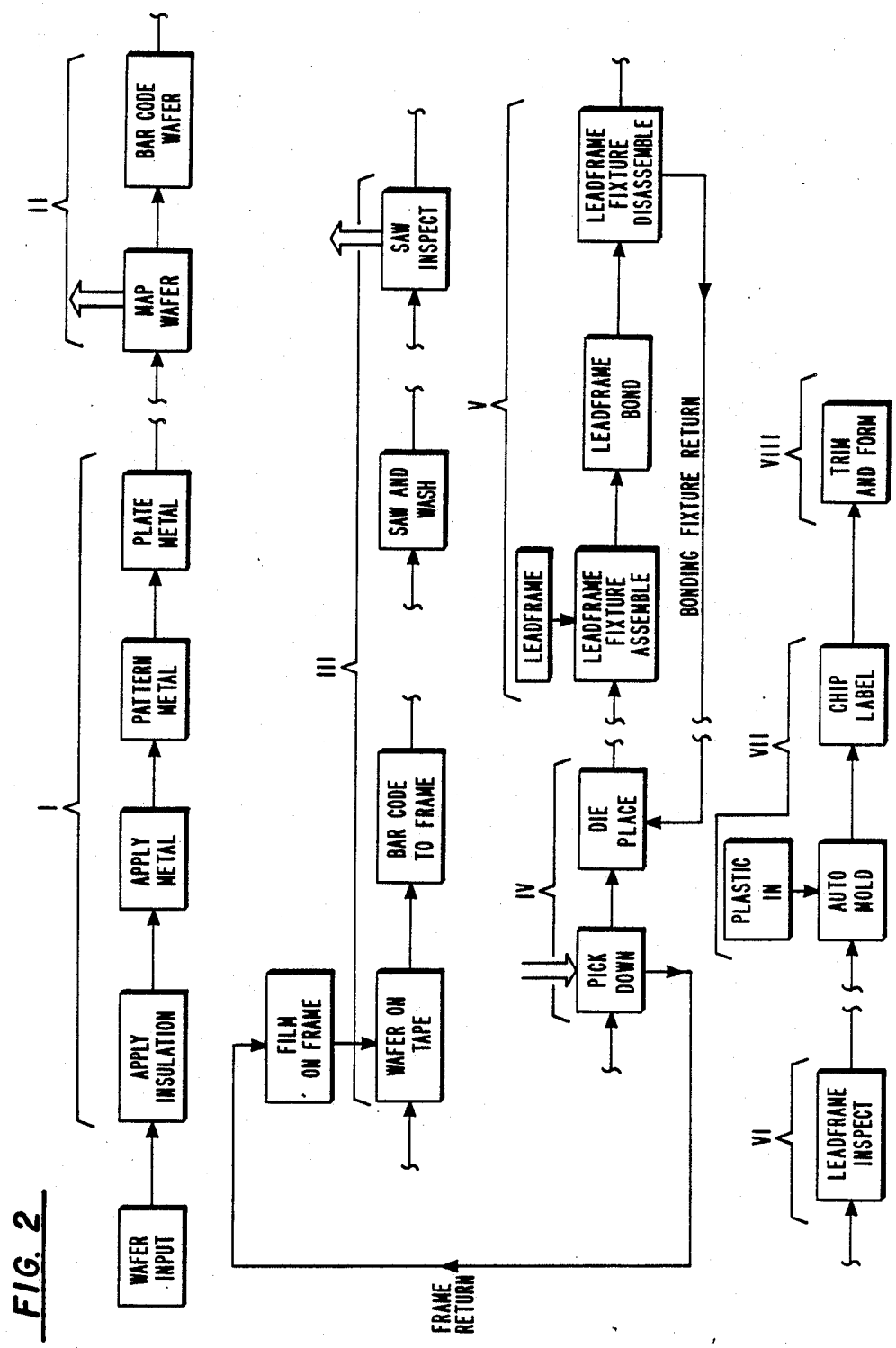
FIG. 2 illustrates the steps in FIG. 1 in more detail.

FIG. 2 sets out the steps in FIG. 1 in more detail and also illustrates the material and data flow. A convention used in this figure is that a broken line indicates a material transport step of the sort of loading the material into a container and moving the container to another location and a double arrow indicates data flow into or out of a computer or other storage device. The three material inputs to the process are the wafers, leadframes and plastic for encapsulation. Two recirculation loops involve, respectively, a frame used to support the wafers during the sawing and die selection steps and a positioning fixture used to maintain a set of dice in alignment with a leadframe segment during the bonding operation.

The different steps of the invention are set forth in more detail below and in copending patent applications filed on the same date herewith and assigned to the assignee hereof.

STANDARD CONTACT PADS

Returning to the first major step, the illustrative dielectric layer is a polyimide such as Dupont 2525 applied with the thickness of 6 microns and cured at a temperature of greater than 260 C. There may be a nitride or other layer below the polyimide to improve adhesion to the reflow glass or other top layer. The electrical contact pads that have been previously formed in the integrated circuit chip by conventional processing techniques are exposed by applying a photoresist, either liquid or in the form of a tape, on top of the dielectric and etching down through it a passageway to the metal contact pad in the circuit in a conventional manner. A "via" will be formed by filling the contact holes with a metal or other conductor until the surface of the dielectric is reached. The photoresist is stripped off and a layer of metal is applied by any technique, such as sputtering, over the surface of the polyimide. In one example, the polyimide was back sputtered to prepare the surface, after which 600 Angstroms of 10% titanium +90% tungsten followed by 1000 Angstroms of copper and titanium sputtered simultaneously, followed by typically 3 microns of copper were sputtered on. A second layer of photoresist is applied and patterned to define a set of metal leads in the metal layer. The leads reach from the vias penetrating the dielectric to an area in the center of the chip which has a standard pad array of pad contacts that is the same for all the chips that have the same number of leads. For example, a 16 pin chip will have the same standard pad array, of size about 0.016" by 0.016" in a standard configuration having dimensions of 0.126" by 0.126", whether it is a memory or any other logic device. The standard pad array will be sized so that it fits on the smallest chip that is to be used with that leadframe. Optional versions of the invention employ a pad array that is arranged for some particular purpose.

The exposed areas of the metal are plated with a solder composed of a standard mixture of lead and tin in a conventional electrolytic plating process that employs a mixture of 95% tin and 5% lead. The photoresist is stripped and the plated areas of the metal layer are used as an etching mask in the next step in which the remaining unwanted area of the metal layer is etched away in a bath of hydrogen peroxide plus ammonium hydroxide followed by hydrogen peroxide, which does not attack the solder.

Figure 3A:
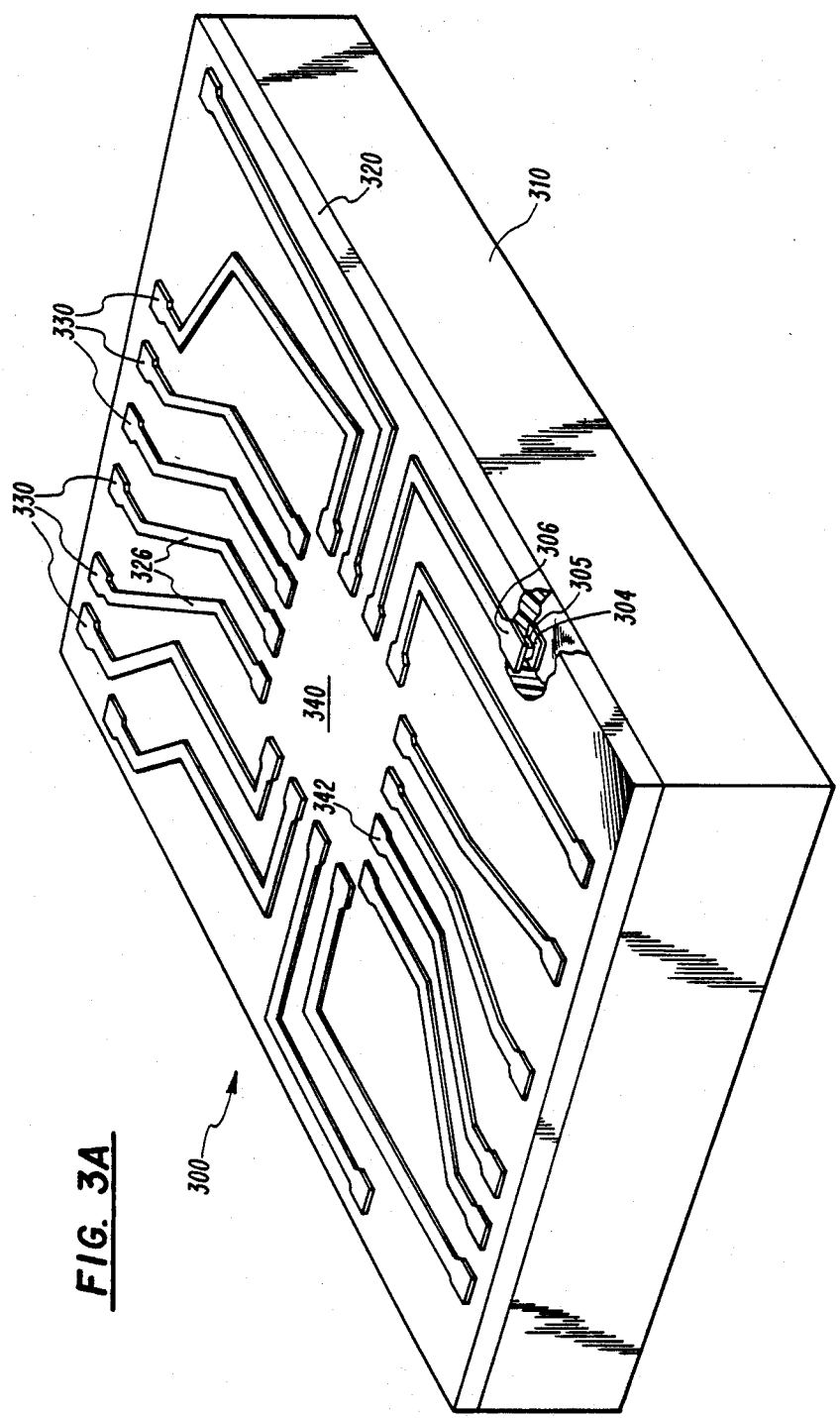

There now remains a chip 300 of the form illustrated in FIG. 3A, in which die 310 has on it a thick layer of polyimide 320 and a network of metal lines 326 leading from the contact areas 330 on the outside of the chip to the standard pad array 340. The metal lines 326 have lower inductance greater thermal conductivity and greater strength compared to the wires that were previously used.

In the example shown in FIG. 3A, the first contacts and the vias through the polyimide layer are all formed on the perimeter of the chip. This figure illustrates a chip in which the layout design was made for the old wire-bonding method in which the contact areas had to be on the perimeter of the chip. An advantage of retaining the old design, besides saving the expense of a new layout, is that it is possible to use conventional wire-bonding processes when added capacity is required. To do this however, requires that the additional dielectric and metallizations for the standard pad process is not used.

It is also possible to use the invention and put the contact areas through the dielectric at any convenient location, as shown in FIG. 3B. The vias for these leads are shown as originating at different locations on the chip surface, not exclusively at the edge as was the case in the prior art. Lead 348 is shown as connecting a via that is located within the standard pad array. Lead 343 is connected to a via-section 344 through a bridge, not shown in the drawing, that is placed on top of the passivation layer of the underlying chip below the polyimide. This illustrates an additional degree of freedom in routing leads and placing components that is provided by the invention.

A via 305 is shown in FIG. 3A in a cut-away portion of the figure as extending from a lower contact area 304 to an upper contact 306 at an end of one of leads 326. The lower contact pads in current practice are typically 4 mils by 4 mils. With such a large area to make contact, the alignment tolerance for the formation and location of the vias and the placement of leads 326 are typically ±2 mils to 3 mils, which is much greater than a typical tolerance of ±½ ml to 1 mil for connecting leads in the precision processes that are used with conventional wirebonding.

The steps of forming vias and putting down leads may be performed in the front-end using the standard machines for photolithography, if that is convenient. Since the requirements for putting down these metal leads are much less stringent in position alignment than the usual front-end work, it may be preferable to use thick-film technology, such as screen printing, to pattern the dielectric and top leads. Typically, the thick-film technique will be ¼ to ½ the cost of the precision techniques.

SAW

Figure 4:
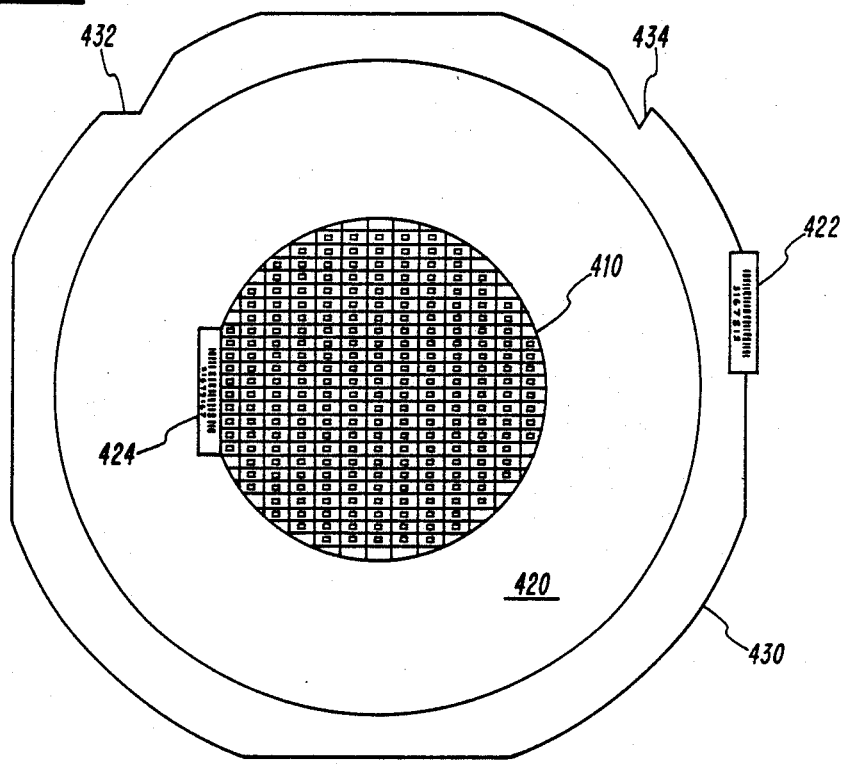
FIG. 4 illustrates a wafer mounted on tape.

In the next major stage of the process (Step III), the wafers are accurately mounted in a fixture and the dice are cut apart. Referring now to FIG. 4, wafer 410 is accurately mounted on an adhesive tape 420 that has been stretched over a frame 430. Since the dice on a wafer are positioned in a rectangular array, a simple reference system that is all that is necessary is a pair of detents 432 and 434 that define a reference direction. The wafer is positioned so that a reference point 411 on the wafer is positioned with a known relation to detent 432, say, in a coordinate system aligned with respect to the detents. The point in the sequence for establishing the coordinate system is also optional. At this time, an identifying label on the frame is correlated with the identifying number on the wafer. This may be done by applying a new label to the frame that matches the wafer label; or by reading a permanent label on the frame.

A conventional automatic saw cuts entirely through wafer 410 along the "streets" that separate the dice. This is in contrast to the prior art, in which the wafer is cut partially through ("scribed") and the dice are broken apart. In a method according to the invention, the dice remain in their positions during the separation process, in contrast to the prior art, in which the identity of the dice is typically lost when they are broken apart and processed. Since the identity of the dice is preserved, it is possible with this invention to track an individual die through the manufacturing process.

In an optional method, the saw has the ability to detect damage done to chips during the sawing process and the test data stored in the computer can be updated to identify damaged chips. A saw with the optional damage-identification feature is a K&S Model 797. The wafers are conventionally cleaned by cleaning equipment that is integral with the saw system.

SELECT DICE

Figure 7A:
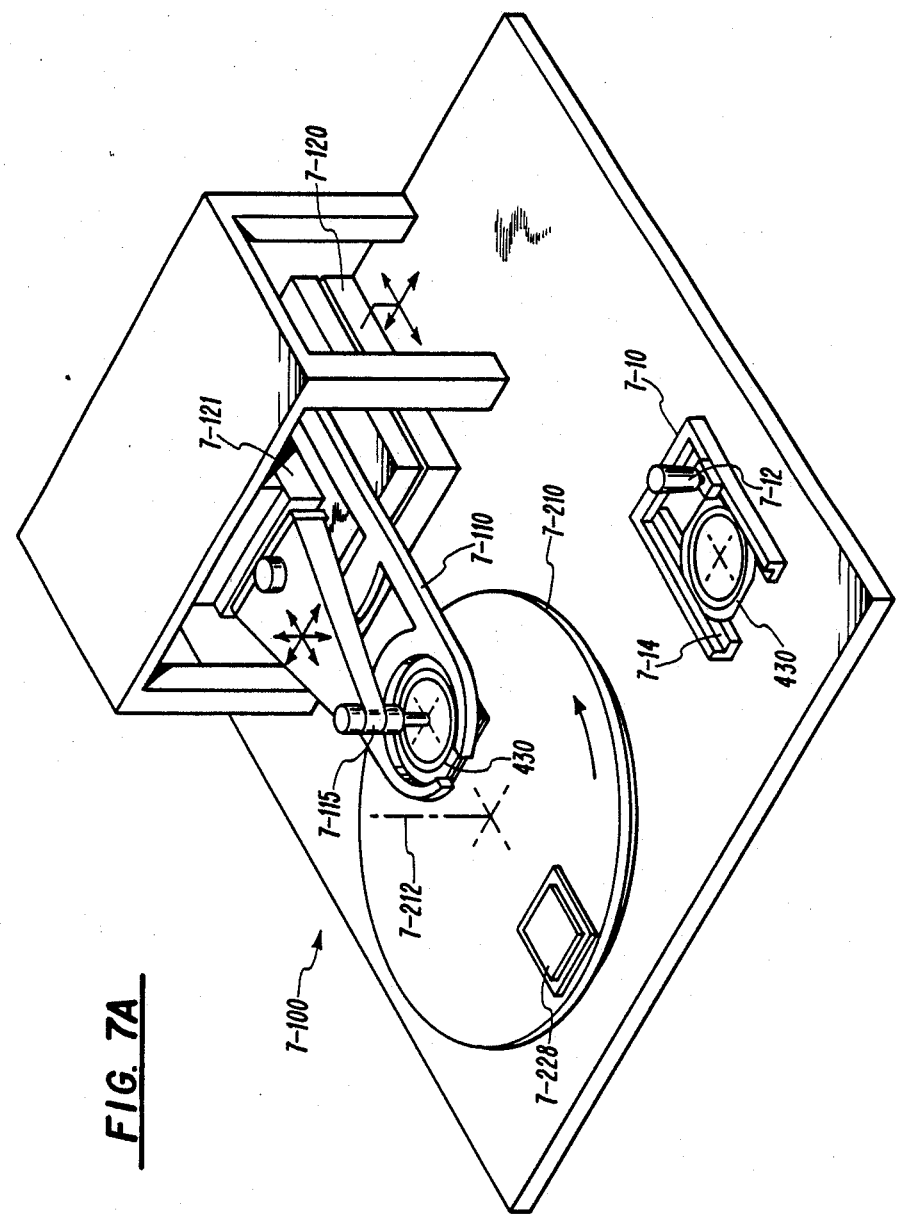
FIGS. 7A-7C illustrate a layout for a machine used for pick-down die selection from a sawn wafer into a die storage carrier.

Referring now to FIG. 7A, there is illustrated an apparatus used to implement the sorting process of picking out the good dice or dice with desired performance levels. More detail of the process steps is shown in FIG. 2, which shows steps that are part of major steps III, IV and V. Referring now to FIG. 2, an optional inspection step that may be considered part of major step III or IV inspects the sawn wafer and updates the "wafer map" if any dice have been damaged in the sawing process. The device is commercially available and is part of the saw work station. The washed wafers are then transferred to a work station to be described below, where the wafer identifying label is read, then to the picking station where the stored data is related to the aligned wafer. An optional inspection step that may be considered part of major step III or IV inspects the sawn wafer and updates the "wafer map" if any dice have been damaged in the sawing process. The device is commercially available.

The die selection process is discussed in more detail in connection with FIG. 6. During this sequence, tape frames are cycled in a recirculation loop, indicated by a reverse line in FIG. 2. When the supply of usable dice from a wafer is exhausted, the frame is moved to a station where the old tape and scrap dice are removed and the empty frames are brought back to the input station.

Referring now to FIG. 7A, a rotary indexer 7-210, illustratively rotating under computer control, holds a set of die holders, two of which are shown as 7-220 and 7-228. A convention used in this specification is that the first number of a hyphenated reference numeral refers to the figure in which the item is introduced or explained in most detail. Each die holder (referred to as a "waffle pack" because of its appearance) receives dice into a rectangular array of receptacles as they fall away from a wafer 410 in a process that is described more fully below.

When a waffle pack is filled, indexer 210 rotates an empty pack into position. The full pack is rotated into an unloading position and passed to an inversion station where a matching waffle pack is aligned on top of the dice and the waffle pack plus dice "sandwich" is inverted so that the dice are resting with the contact side upwards ready to be placed in a bonding fixture. This inversion step may be performed manually or automatically. Optional forms of inversion are described below.

A tape frame is first identified in bar code reader station 7-10 in FIG. 7A, in a sequence (6-114 in FIG. 6) in which tape frame 430 rests on shelves 7-14 and either the frame is moved or reader 7-12 is slid over the label. A conventional bar code reading system reads the code and transmits it to the computer, where the data from the test results are fetched from memory (steps 6-200) to guide the die-selection process.

Figure 7B:
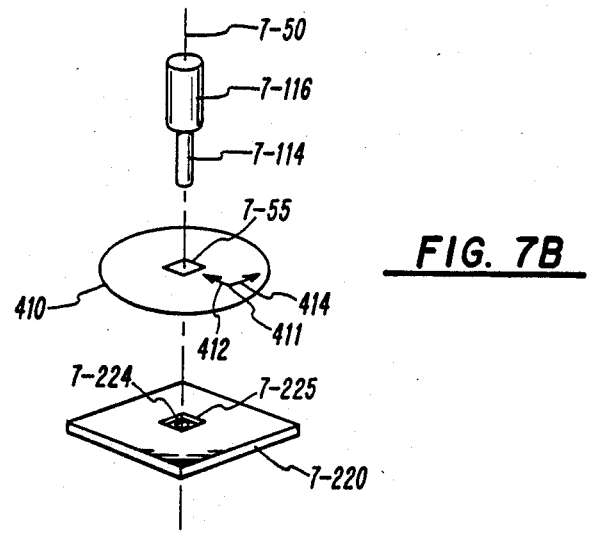

Further details of the selection process and apparatus are illustrated in FIG. 7B, in which axis 7-50 passes through assembly 7-115 comprising energizer 7-116 and striker 7-114 above die 7-55 which is part of wafer 410. Wafer 410, as described above in the discussion of FIG. 4, adheres to tape 420 held in frame 430, which is mounted with wafer 410 on the lower side. Die 7-55 is the next die to be removed from the die array that was formed on wafer 410. Frame 430 is supported by holder 7-110 and positioned at axis 7-50 by X-Y drive 7-120, shown in schematic form in FIG. 7A, as it is a conventional device (Kulicke & Soffa Model 350-103). Frame 430 is aligned in position, as described in the discussion of FIG. 4, by the matching of detents 432 and 434 with pins in holder 7-110. Unnecessary details of the apparatus have been omitted in order to show the essential relationship with the greatest clarity.

Below die 7-55, receptacle 7-225, formed in holder 7-220 awaits the die. Holder 7-220 is one of two or more holders (7-220, and 7-228) resting on plate 7-210.

Figure 7C:
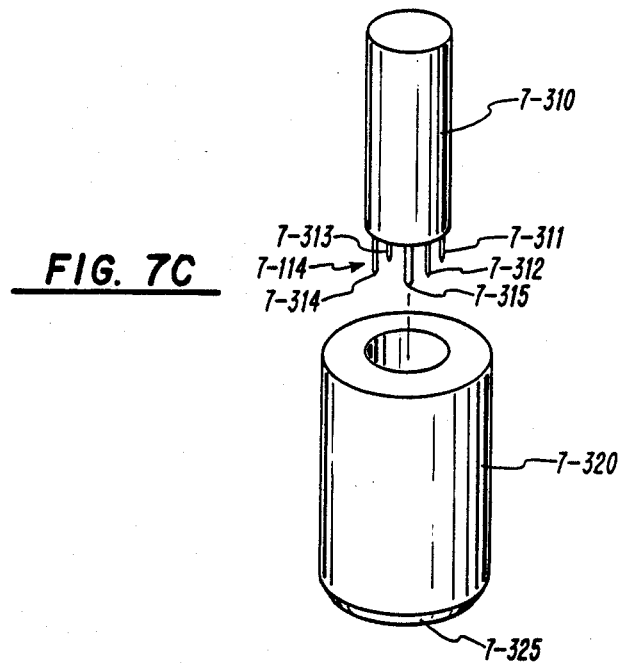

In operation, the striking assembly 7-115 presses striker 7-114 against the top of tape 420, deflecting it downward by approximately one quarter inch. X-Y drive 7-121 slides striker 7-114 over the tape to the correct position. The pick-down operation is effected by air valve 7-116 (one version of the energizer) which is energized to drive striker 7-114 downwards, striking tape 420 at a point above die 7-55. Die 7-55 is gently pushed from the adhesive tape and falls into receptacle 7-225. Pin assembly 7-114 penetrates tape 420 with a set of needles shown in FIG. 7C. Four needles, 7-311, to 7-314 are rigidly attached to shaft 7-310. A fifth needle 7-315 extends 0.050 inch below the others and is spring-loaded with a force of three ounces.

Illustratively, assembly 7-114 is projected downward by a conventional two-way air valve 7-116 with a force of one pound, the air pressure being on for a period of about 20 milliseconds. Needle assembly 7-114 is retracted when its travel has triggered an optical limit switch that is set so that the tips of needles 7-311 to 7-314 project about ⅛ inch below lower surface 7-325 of holder 7-320. Lower surface 7-325 has a radius of curvature of two inches to avoid excessive stress on the dice.

An important function of needle 7-315 is to suppress bouncing of the die. The die falls a nominal distance of 3/16 inch to receptacle 7-225. It may bounce partially out of the receptacle in extreme cases; it may lie against a side; or it may be chipped by impact with the bottom or sides of the receptacle. The spring on needle 7-315 absorbs the kinetic energy of the die, so that it quickly comes to rest with the minimum number of impacts.

Assembly 7-114 may advantageously be fitted with a conventional quick release mounting to facilitate rapid change from one assembly having a needle spacing suited for a large die to another assembly having a different spacing for a different die. Receptacle 7-225 in FIG. 7B is shown in the figure as a recessed rectangle, but other forms will be evident to those skilled in the art. A slight vacuum can be used to maintain the die in the interior of holder 7-220, communicating with the interior of receptacle 7-225 through hole 7-224 in FIG. 7B, so that die 7-55 is further prevented from bouncing out of alignment. The vacuum within holder 7-220 is maintained by forming a wiping seal at the lower surface of plate 7-210. As the plate rotates, an aperture in plate 7-210 comes to rest over a fixed vacuum line that is not shown in the drawing. The aperture establishes communication between the interior of holder 7-220 and the vacuum.

When holder 7-220 is full, or when a different performance level of die is to be selected, the drive within plate 7-210 rotates plate 7-210 to position the next holder. Holder 7-230 may be removed and passed to the next stage or remain stationary to accept additional dice of the same performance level, to be selected from a different wafer.

The assemblage of the two X-Y drives 7-120 and 7-121 and holders, indicated generally by the numeral 7-100, is a commercially available item from Design Components Inc., Medford, Mass., Model Numbers DC44 and DC88, modified to hold the driving pin 7-115 and frame holder 7-110. The device 7-100 operates under the control of a computer, either the central computer indicated in FIG. 1 or a small local computer. The essential information that must be handled is the position of the current empty receptacle 7-225, the position of the next good die 7-55 relative to the coordinates centered at point 411 and the position of point 411 relative to holder 7-220. Axis 7-50 is, of course, centered on the receptacle 7-225 next to be filled and pin 7-115 and the next to be removed die are positioned accordingly.

Figure 6:
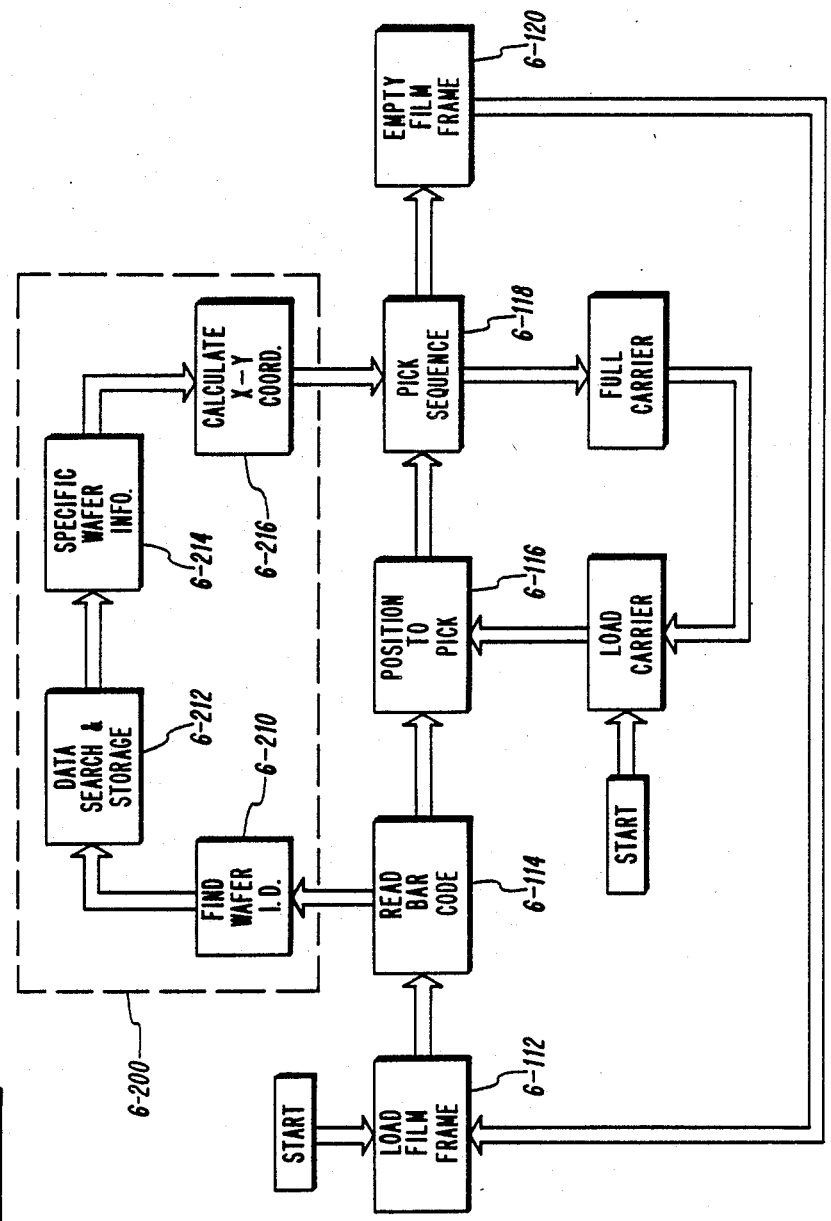
FIG. 6 illustrate a sequence of selecting the die from a sawn wafer.

The sequence to be followed in knocking out good dice is indicated in FIG. 6, in which a tape-frame is loaded manually or by robot (6-112) to start the process; the identifying bar code on the frame is read in step 6-114. The frame number is read and sent to a computer or stored in memory and compared against the data for the numbered or coded wafer. The exact X-Y position or wafer map for all good or selected die on the wafer is known and associated with the frame number allowing good die to be selected. The information stored in the computer is searched in sequence 6-200, in which the result at step 6-216 is the X-Y coordinate of the first (next) good die. A parallel sequence starts with loading an empty carrier 7-220 and rotating table 7-210 to position it close to device 7-100. The pick sequence, (sometimes referred to as "pick-down" in contrast to a conventional "pick-up") is represented in step 6-118.

The pick-down sequence is repeated until the first to occur of the depletion of the good dice that were on wafer 410 and are now in an array on tape 420 and the filling of carrier 7-220. In either case, a new tape carrier or dice holder is substituted and the sequence is restarted. In an alternate sequence, only dice having certain criteria are selected in one pass and other good dice that are usable for a different application are left to be selected later.

While positioned in tape 420, the dice have their contacts facing down toward holder 7-220. It is necessary to invert the dice, so that when a die is placed in contact with a leadframe, the standard pads touch the leadframe; and this is done in the next step. The inversion may be manual, or may be carried out by machine, either singly or in groups.

SINGLE INVERSION

Figure 8A:
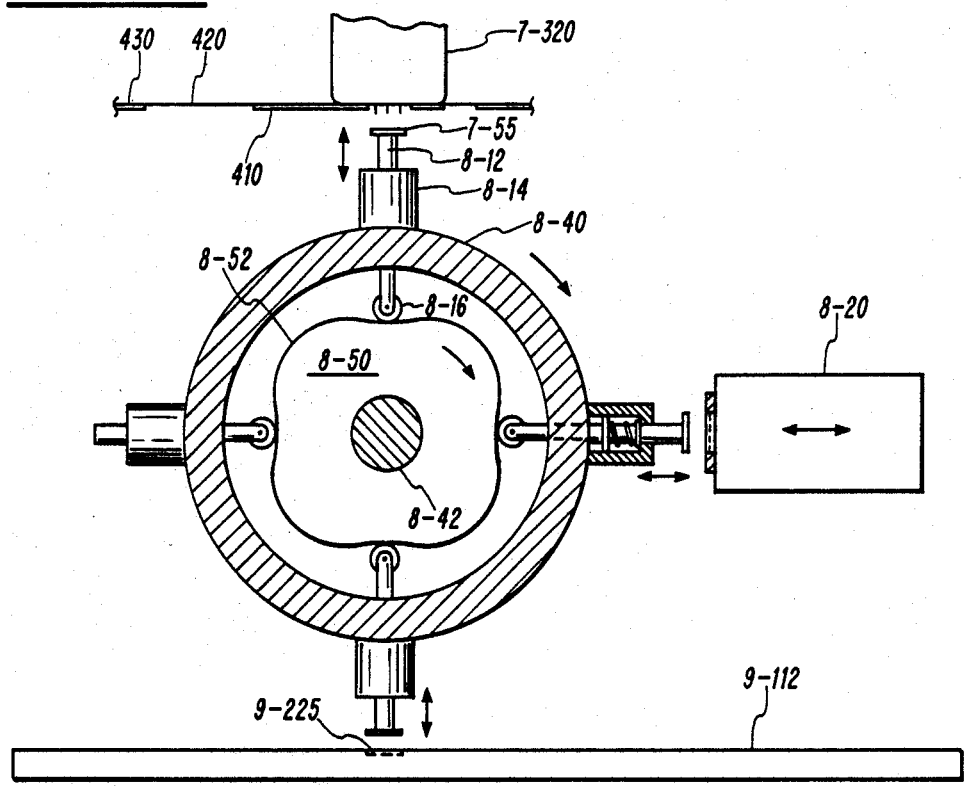
FIGS. 8A-8C illustrate an apparatus for an intermediate inversion step in the operating sequence of the apparatus used in FIG. 7.

An apparatus for performing the inversion step one die at a time is illustrated in FIG. 8A, in which die 7-55 is knocked off wafer 410 by needles 7-312 to 7-315 in head 7-320 as before. Instead of falling directly into receptacle 9-225 in holder 9-112, however, the die falls a short distance onto tube 8-12 extending upward from housing 8-14 supported by rotating cylinder 8-40. The die is held by vacuum action, the vacuum being maintained and switched by conventional means not shown in the drawing. Tube 8-12 moves up and down as indicated by the arrows in response to cams 8-52 on cam cylinder 8-50 rotating about axis 8-42, co-axial with cylinder 8-40. Cam cylinder 8-50 may rotate with cylinder 8-40 or rotate independently of it, under the control of conventional means not shown.

In operation, a new die is moved into position, nominally centered on tube 8-12, but actually somewhat misaligned because of error in the placement of wafer 410 on tape 420, as well as errors in aligning the supporting tape frame 430. Cam cylinder 8-50, rotates, bringing cam 8-52 into position under cam follower 8-16 and thus raising the tip of tube 8-12 into position to receive the die.

At the same time that the top tube 8-12 is receiving a die, the bottom tube 8-12 extends to deposit its die in receptacle 9-225.

Receptacle 9-225 will typically be only 0.002 inches greater in size than the die, in order to ensure accurate alignment of the leadframe with the die, so that the die will have to have its position corrected before it can enter. In FIG. 8A, this precising step is shown as being effected by preciser 8-20 which engages the die and, by conventional tapered surfaces, forces it into alignment. This precising step is performed at the same time as dice are deposited at the top and released at the bottom, so that no time is lost.

Figure 8B:
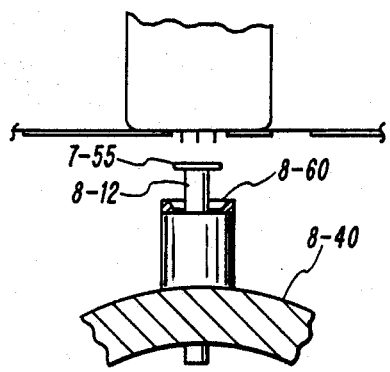

Those skilled in the art will recognize that a precising step may be performed at any of the three positions, or at more than one position. In particular, FIG. 8B shows a preciser 8-60 mounted on holder 8-14, so that the precising step is performed as tube 8-12 returns to a rest position. The vacuum may be turned off as tube 8-12 is lowered, in order to permit the die to slide into position more easily.

Yet another alternative is to have a preciser 8-60' mounted above receptacle 9-225. This preciser could be fixed in space and aligned with axis 8-42 of rotating cylinder 8-40; or it may be aligned with respect to fixture 9-112 (and removed before the leadframe is deposited).

Those skilled in the art will recognize that many alternative apparatus will be able to perform the inversion function. For example, cam cylinder 8-50 may be replaced by hydraulic cylinders, screw drives or any other means for advancing and retracting tubes 8-12. Further, if tape 420 and fixture 9-112 can be positioned with sufficient accuracy, then tubes 8-12 may be rigidly attached to cylinder 8-40, which will reduce alignment errors that result from tolerance in the position of tubes 8-12 relative to cylinder 5-40. In that case, any necessary vertical motion will be provided by holder 7-320 and/or holder 9-112.

MASS INVERSION

Figure 10A:
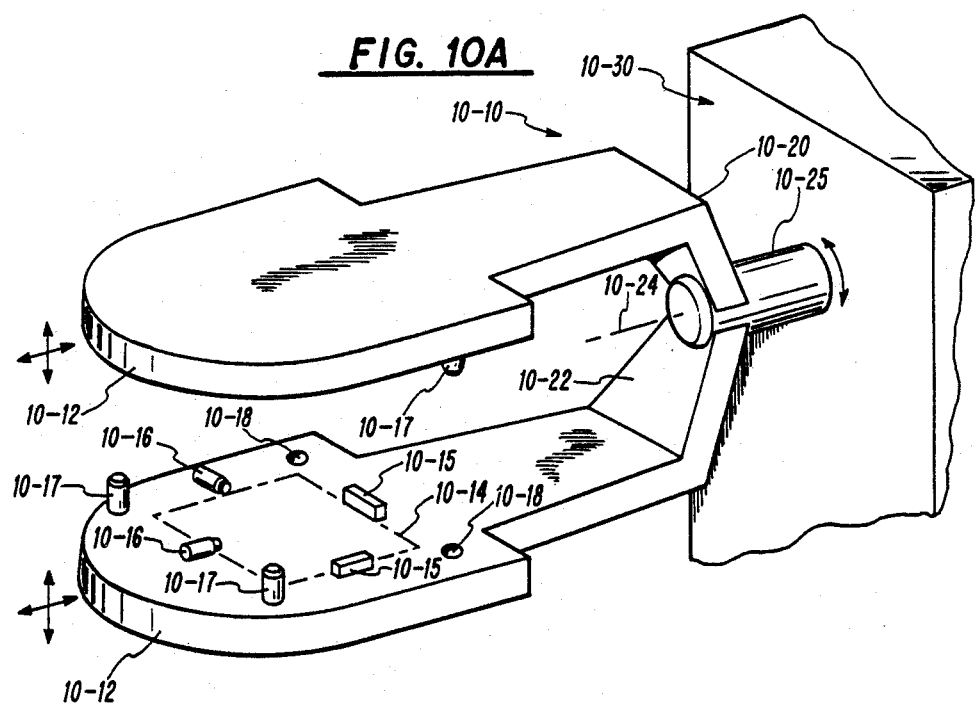
FIGS. 10A and 10B illustrate an alternative device for inverting dice.

A mass inversion step may be performed with the apparatus shown in FIG. 10A, in which two matching inversion plates 10-12 each hold a waffle pack 7-228. Only the lower plate 10-12 is shown, without the waffle pack, for greater clarity in exposition. Initially, a full waffle pack having dice with contacts facing down is placed in the dotted outline 10-14, aligned by stops 10-15 and held in place by compliant members 10-16, each of which is a spring loaded cylinder having a rounded tip. This mechanism is the same as that used in FIG. 7A and the robot gripper is the same.

The overall mechanism indicated by the numeral 10-10 includes holders 10-12 and conventional parallel-motion (parallelogram linkage) means 10-20, and 10-22, which are indicated schematically. These jaws move parallel to axis 10-24 of shaft 10-25 (activated by controller 10-30) from the open position shown in the figure to a closed position centered on the axis. The activating means may be a hydraulic cylinder or a motor. Alignment pins 10-17 and alignment holes 10-18 engage their opposites in the other inversion plate before the waffle packs mate. Optionally, the waffle packs may also have alignment pins for a fine alignment to compensate for position tolerance of members 10-15–10-16.

Once the inversion plates and waffle packs have engaged, assembly 10-10 rotates 180 degrees about axis 10-24 by turning shaft 10-25 under control of a rotating table within controller 10-30. The dice within the receptacles 7-225 of the filled waffle pack will have fallen into the empty one, aided by air pressure and vacuum lines carried within shaft 10-25. These lines will be switched by valves within controller 10-30 from an initial vacuum to hold the dice in the lower pack to a positive pressure to urge the dice into the other pack.

Controller 10-30 is shown schematically in the figure as a box. It will comprise a rotating table or other conventional means for rotating shaft 10-25, together with air and vacuum valves as needed, all controlled by a microcomputer or by hard-wired logic. Those skilled in the art will readily be able to assemble many different controllers that will perform these simple functions and no particular form is required for the invention.

Figure 10B:
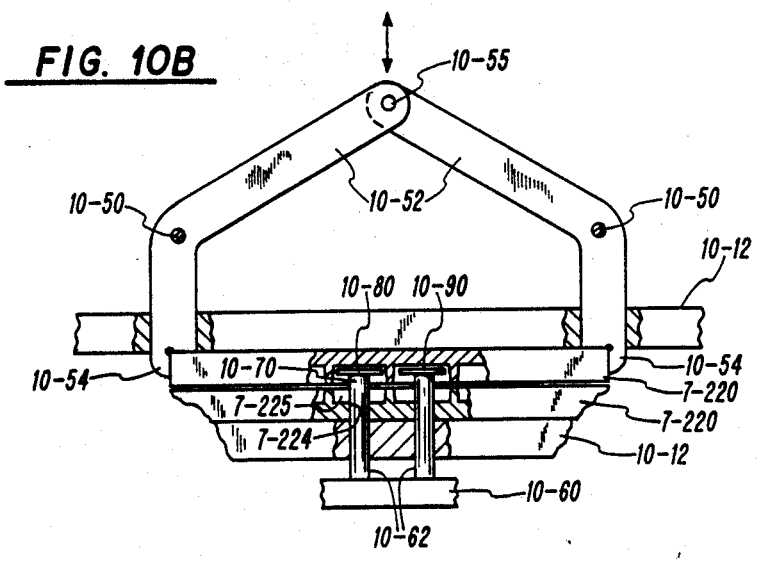

Alternatively, in order to avoid the possibility that a die will lean against one side of a receptacle in the waffle pack, the mechanism shown in cross section in FIG. 10B may be used, in which a portion of mating waffle packs 7-220 and 7-220' having apertures 7-225 with holes 7-224 further includes a frame 10-60 having pins 10-62 that pass through the apertures 7-224. Frame 10-60 is supported in the interior of plate 10-12. Pins 10-62 have top surfaces 10-70 that are wide enough to support chips 10-80. Before the rotation step, frame 10-60 is gently raised by air pressure, spring pressure or any convenient means to pass through holes 7-224 and then lift chips 10-80 almost to the bottom surfaces 10-90 of the receptacles 7-225 in mating waffle pack 7-220'. When the inversion step is performed, chips 10-80 will fall only a short distance, 0.05 inch say, so that the chips will be flat on surface 10-90 of receptacle 7-225.

In order to facilitate smooth operation, both waffle packs may be pivoted to compensate for mechanical misalignment, so that they mate properly. Gripper arms 10-52 pivoting about fixed pivots 10-50 terminate in gripping ends 10-54 that clamp the waffle pack 7-220'. Fixed pivots 10-50 are supported by a conventional means, such as a gymbal mount, not shown in the drawing for clarity. Movable pivot 10-55 joining both gripper arms 10-52 is moved by a hydraulic cylinder or other means as shown by the arrow to engage or disengage the waffle pack. A similar pivot may be used for waffle pack 7-220.

After the rotation, jaws 10-20 and 10-22 separate and the formerly empty pack containing dice with contacts facing up is removed, with the initially full pack remaining for the net inversion.

Those skilled in the art will readily be able to devise different embodiments of the invention in the light of this disclosure. For example, the inverter of FIG. 8A might have 14 receptacles in parallel, extending parallel to axis 8-42, and spaced to match the leadframe spacing, so that only one inversion step per leadframe set of dice is needed. The receptacles on top of such an inverter would be filled and then the complete set would be inverted into the waffle pack. The four tubes 8-12 of FIG. 8A may be replaced by any convenient number spaced about the circumference of cylinder 8-40.

FIGS. 11 and 12 illustrate two alternative devices for performing the inversion step with a full waffle-pack. In FIGS. 11A and 11B, an alternative device to that shown in FIG. 10A uses the same controller 10-30 that rotates shaft 10-25, but in which the two holders 10-12 are supported in a different manner.

Referring now to FIG. 11A, two holders 10-12 and 10-12' are shown, which move in the directions indicated by the arrows vertically, without horizontal motion. The motion is supplied by shaft 11-10 having two areas 11-11, 11-13, which are threaded in opposite directions, respectively. These threads engage mating threads in threaded blocks 11-09 and 11-09' which are part of the supports for holders 10-12. As shaft 11-10 rotates in one direction, holders 10-12 separate so that the waffle-pack may be inserted or removed. Box 11-12 is a schematic representation of a reversible electric motor together with a worm-gear drive for supplying the rotating force to shaft 11-10. Box 11-12 is shown supported by shaft 10-25 which rotates as described above. Electric power is supplied to box 11-12 through the hollow interior of shaft 10-25. In FIG. 14B, a top view of support 10-12 is shown, showing guides 11-14 and 11-14', which serve to maintain holders 10-12 and 10-12' in alignment.

Referring now to FIGS. 12A and 12B, another alternative embodiment of the support and moving mechanism for holders 10-12 is shown. In this figure, only the upper plate has moved to provide clearance for insertion and removal of the waffle pack. Holder 10-12 is rotated about pivot 12-21. The rotating force is supplied by lever arm 12-20 connected by pivot 12-22 to cylinder assembly 12-24, comprising moving cylinder 12-28 and housing 12-26. Cylinder 12-24 pivots about pivot 12-30 that is aligned on axis 10-24. Lifting force is supplied by spring 12-25, which maintains holder 10-12 in a normally lifted position. When air pressure is applied to cylinder 12-28, it extends to expand spring 12-25 and force holder 10-12 down toward axis 10-24, to mate the two waffle packs. During the inversion step, the two plates 10-12 and 10-12' are maintained parallel with their respective waffle-packs 10-14 and 10-14' in alignment. At the end of the rotation step, the upper plate 10-12 is lifted, as indicated by the arrows, to permit the robot gripper arm to remove the bottom waffle pack. FIG. 12B shows a top view of this device. Cylinder 12-24 is the upper cylinder in this case and cylinder 12-24' is shown in a cutaway view. Air pressure for the two cylinders 12-24 and 12-24' is supplied along hoses passing through the interior of hollow shaft 10-25, as before. Controller 10-30 serves to open and close the holders and rotate the shaft, as described with respect to FIG. 10.

In all the embodiments that perform the inversion step with the waffle packs, there will be an additional pick and place step, shown as "Die Place" in FIG. 2, in which the upward-facing dice in holder 7-220' are removed and placed in a 14 chip holder, similar to 7-221, that has the chips positioned to align with a leadframe set for the bonding operation. This is a conventional pick and place operation, however, it is a parallel process operation in which one row of holder 7-220' is picked up simultaneously; placed in a preciser to secure the correct alignment; then placed in the bonding fixture with the correct alignment.

Referring now to FIG. 13, there is shown a perspective view of a simplified transfer apparatus. FIG. 13 is an exploded view, in order to present the apparatus more clearly. Row 13-130 of waffle pack 7-220 (in this figure, a waffle pack having the spacing of the bonding fixture is used) is empty, having had its dice, indicated by the numerals 9-230, placed in preciser 13-100 by pick-up fixture 13-120. In the step illustrated, fixture 13-120 is about to pick up simultaneously row 13-132 of dice 7-55 in receptacles 7-225 of waffle pack 7-220 and the row of dice 9-230 in alignment fixtures 13-225 of preciser 13-100.

The dice will be held by vacuum to the tips of gripping probes 13-112 and 13-110, which vacuum is distributed by a conventional manifold in the interior of fixture 13-120. Two pairs of probe tips 13-110' and 13-112' are shown in contact with dice 7-55 and 9-230. The probes have conventional rubber or plastic tips in order to maintain the vacuum.

When the dice have been gripped, fixture 13-120 will be lifted along the Z-axis in 13-140 and translated to the left along the x-axis, so that probes 13-110 carrying aligned dice will be located above receptacles 9-225 in lower bonding fixture 9-110 and probes 13-112 carrying unaligned dice from row 13-132 will be located above preciser angles 13-225 in preciser 13-100. As a convention, the receptacles or alignment fixtures are referred to as -225, with the prefix on the identifying numeral indicating a drawing that shows further relevant information. Fixture 13-120 is to be lowered and the vacuum released, so that dice are simultaneously deposited in the bonding fixture and the preciser.

The function of preciser 13-100 is indicated by its name. The dice in waffle pack 7-220 are resting at random within oversized receptacles 7-225, which are made with a loose tolerance (typically ⅛ inches greater in length) to facilitate fast transfer. Preciser 13-100 receives the dice and, by tapered surfaces on preciser angles 13-225, guides the dice into position at the corners with a typical tolerance of 0.002 inches that is sufficient to allow for reliable insertion into bonding fixture 9-110. In order to allow for tolerances in the position of dice 7-55, preciser 13-100 may be offset along the x and y axes, as indicated by arrows 13-144, to ensure that all dice make contact with the tapered sides. If that is done, then fixture 9-110 will also be offset to match the spacing of probes 13-110 and 13-112. Preciser 13-100 may also be moved to positions that will accept different size dice as shown by arrows 13-144. If the preciser is to operate with standard dice, then rectangles may be used instead of preciser angles 13-225.

In the embodiment illustrated, waffle pack 7-220 has several rows of dice, 13-132 being the curent row. The waffle pack has slid below preciser 13-100 in order to present row 13-132 at the correct position. As a consequence, fixture 13-120 must have probes 13-110 and 13-112 offset vertically by an amount that will allow clearance below preciser 13-100 for waffle pack 7-220. Also, fixture 9-110 will have to be positioned with respect to preciser 13-100 by the same vertical and horizontal displacement as that between waffle pack 7-220 and preciser 13-100, in order to receive the dice. Supporting members and mechanisms for translating the waffle pack, preciser, bonding fixture and pickup fixture are omitted from the drawing in order to represent the essential spatial relationship of the apparatus with the greatest clarity. Those skilled in the art will readily be able to add any of a number of one or two dimensional drives to effect the motion. Illustratively, waffle pack 7-220 and bonding fixture 9-110 may be placed and removed by the same general purpose robot having a conventional gripper. Pickup fixture 13-120 may be moved by a dedicated two-dimensional translator.

BOND

Figure 9:
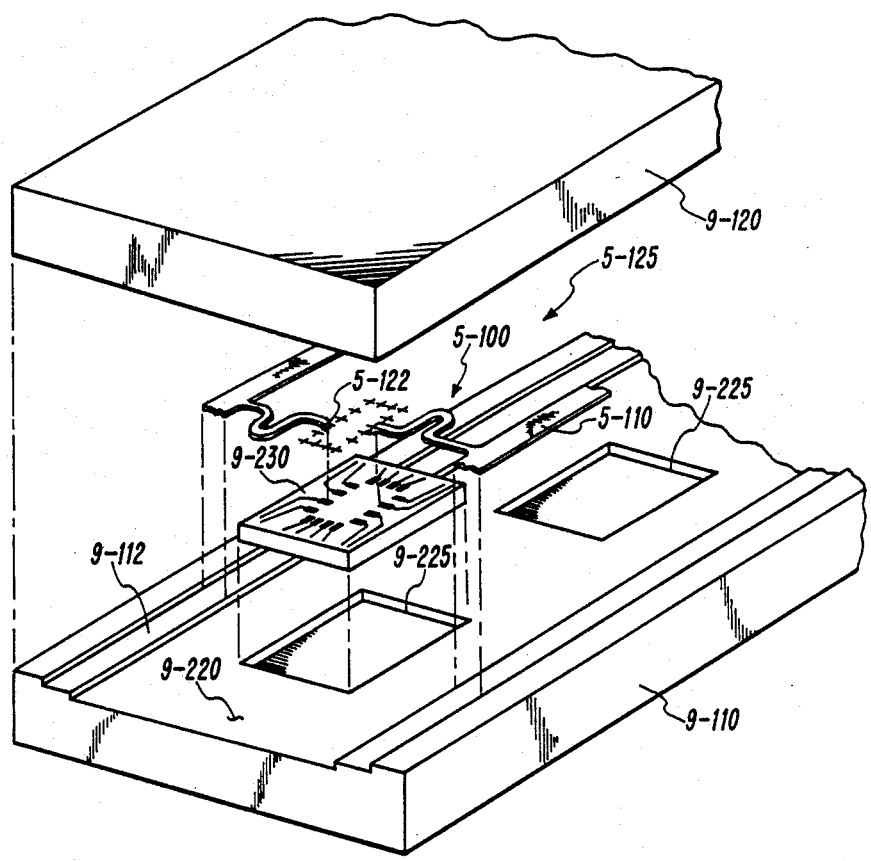
FIG. 9 illustrates a carrier used to hold a leadframe and die during the bonding step.

The assembly for the final bonding step (Step V in FIG. 1 and Leadframe Fixture Assemble, Bond, Disassemble in FIG. 2) is shown in an exploded view in FIG. 9, in which holder 9-110, represented schematically, holds 14 chips with the correct spacing, only two of the receptacles 9-225 being shown. Above receptacle 9-225, there is positioned chip 9-230 and, above the chip, a set of finger contacts 5-122 in leadframe 5-100, part of leadframe strip 5-125. The details of the leadframe will be described below. Cover 9-120 presses down on edge 5-110 of leadframe strip 5-125, which edges rest on shelves 9-112 to position the outer parts of the strip so that the contact tips will be deflected slightly. This deflection is done to compensate for inevitable fluctuations in the position of the tips during the manufacturing process, so that reliable contact is ensured during the bonding operation. The deflection is effected by making the depth of receptacle 9-225 such that the top of chip 9-230 projects above the plane of shelves 9-112 by a set amount. The amount of deflection, (0.005 inch to 0.007 inch) is illustratively several standard deviations of the nominal fluctuation of the tip position to ensure reliable joint formation. The edges 5-110 of leadframe strip 5-125 will be forced on to shelves 9-112 by cover 9-120 and tips 5-122 will thus be pressed against the pads by the spring constant of the leads.

Figure 5:
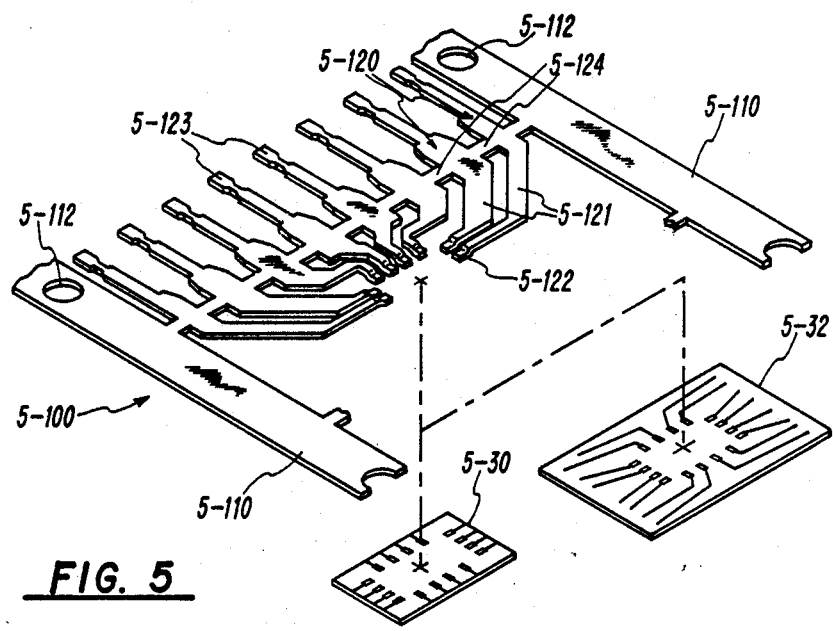
FIG. 5 illustrates a portion of a leadframe.

A typical leadframe used in the invention is illustrated in FIG. 5, in which half of an individual frame is shown. The individual leadframes are stamped out of a ribbon of metal that may be an inexpensive copper alloy, in contrast to the expensive alloy having the correct thermal properties that is used in the standard prior art process. Strips 5-110 on either side of the ribbon serve to carry the actual leads 5-120 along. Leads 5-120 have an exterior end 5-123, shaped either for insertion in a socket or for surface-mounting, and an interior portion 5-121 for attachment to a die. The two portions are joined by segments 5-124 that will be severed after the bonding step. Holes 5-112 are provided to give a reference in positioning the leadframe. At the end of each lead segment 5-121, there is a region, 5-122, in which the lead is bent in a quarter circle (or bent twice to form a parallel contact section) to form a standard dimension flat contact area. Each of the different lead segments 5-121, with its different length, has been shaped to provide substantially the same spring constant so that the contact areas 5-122 will be uniformly pressed against the mating pads on the die to give correct alignment for the soldering operation. The leads 5-120 have been tinned with solder in a previous step in the fabrication of the lead frame ribbon.

It is an advantageous feature of the system, but not an essential one, that a family of chips that have the same number of pins have the same standard pad array on top of the dielectric. For illustration, two dice 5-130 and 5-132 of different size are shown together with the leadframe. With this feature, it will then be necessary to have only one ribbon of leadframes for the entire family of chips, with substantial savings in inventory.

Both the contact pads 342 of the die and the tips 5-122 have been tinned and are ready to be heated. The bonding is done by a vapor phase reflow soldering technique or other means of heating the materials to reflow the fusible alloys. These alternative techniques include infra-red heating, conveyor ovens, hot gas heating or laser heating. In vapor phase reflow, a liquid such as Flourinert FC-71 is maintained at its boiling point, the liquid having been selected so that its boiling point is above the soldering temperature. The soldering assembly of holders 9-110 and 9-120, with chips plus leadframe maintained in alignment, is inserted into a container or over that is filled with the vapor at the boiling-point temperature and held there until the solder has melted and flowed to form a bond. A typical length of time for the heating cycle is 5 to 15 seconds. This boiling point temperature is typically above 225 degrees C. but below 300 degrees C. In contrast, the present wire bonding and die attach steps are performed at temperatures of up to 460 degrees C. and performed individually. In order to reduce the length of the heating cycle, the bonding fixture should have low mass and many apertures to permit the vapor to flow freely about the solder joints. Holders 9-110 and 9-120 have been shown schematically in order to reduce the complexity of the drawing.

An important economic benefit of this invention is that all the leads are soldered at the same time. This is in contrast to the wire-bonding technique, in which the leads must be bonded one by one. The soldering step takes no longer for a 28 pin chip than it does for a 16 pin chip.

Those skilled in the art will readily be able to make many alternative forms of chip-inverting apparatus in the light of this disclosure, either of the sort in which an intermediate waffle pack or other chip carrier is inverted; or of the sort in which the chips are inverted during the process of transfer from the tape frame to the bonding fixture. In particular, any convenient number of chips may be handled in both approaches.

Figure 8C:
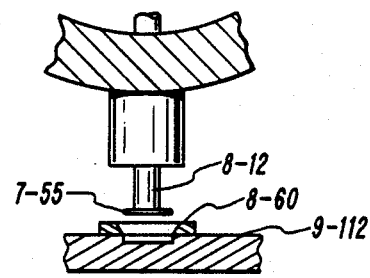

A waffle pack may contain fewer chips than illustrated—an attractive version being one in which the waffle pack has the same spacing and number of receptacles as the bonding fixture and consists of a single row, so that the inversion step deposits dice directly into the first lower bonding fixture, with the precising function being accomplished by a preciser mounted above the waffle pack or temporarily between the bonding fixture and the waffle pack. Similarly, as described above, the sequential embodiment of FIG. 8 may be altered to handle more than one chip—as many as a bonding fixture load.

Also, the precising step may be performed at various times in the sequence of steps. If the apparatus permits sufficient accuracy of placement (or if the contact pad-leadframe tolerance is sufficiently great) the precising step may be eliminated. In one particularly simple embodiment, the positioning drive 7-121 carrying tape frame 430, or the support for dice receptacle 7-220, is adjustable, so the the receptacle can be aligned with wafer 410 sufficiently accurately to permit the elimination of the precising step in the embodiment of FIG. 8 or of FIG. 7. In the latter case, there would still be an inversion step.

Many other embodiments of the invention may be devised and the scope of the appended claims is not intended to be limited by the illustrated embodiments.

We claim:

1. An apparatus for manipulating integrated circuit dice comprising:
    means for holding an array of dice contact side down at a predetermined source position, said dice being adhesively attached to the bottom side of a support member;
    means for knocking a selected die from said array of dice down from said support member at a predetermined source position directly onto rotatable intermediate receptacle means, wherein said means for knocking a selected die includes striking means, positioned above said support member, for striking downward on and penetrating said support member to dislodge dice therebelow wherein said striking member includes a needle member having four needles positioned in a rectangular array and a fifth spring loaded needle positioned within said rectangular array and extending a predetermined distance below the others of said needles for perforating said support member and striking a die adhesively attached therebelow and means for driving said needle member downward;
    a rotating cylinder;
    a tube slidably mounted in a housing supported by said rotating cylinder;
    a cam cylinder within and coaxial with said rotating cylinder;
    a cam follower attached to said slidable tube, wherein relative rotation of said cam and said cylinder causes the sliding translation of said tube within said housing in a direction substantially perpendicular to the outer surface of said rotating cylinder;
    means for rotating said cylinder 180 degrees about a horizontal axis; and
    means for holding said selected die during rotation and for releasing said selected die after rotation.

2. An apparatus for manipulating integrated circuit dice comprising:
    a dice holder for holding an array of dice contact side down, wherein the dice are adhesively attached to the bottom side of a support member;
    a cylinder supported below said dice holder;
    a slidable arm connected to the outer surface of said cylinder, wherein said slidable arm is moveable in a direction perpendicular to the outer surface of said cylinder;
    a cam cylinder rotatably mounted within and coaxial with said cylinder;
    a cam follower connected to said slidable arm and to said cam, wherein relative rotation of said cylinder and said cam cylinder causes said slidable arm to move in a direction perpendicular to the outer surface of said cylinder;
    means for independently rotating said cylinder and said cam cylinder;

means for releasing a die from said die holder to a position on said slidable arm; and means for holding such die onto said slidable arm during rotation of said cylinder.

3. The apparatus of claim 2, further comprising:

a die adjuster located adjacent to said cylinder, wherein movement of said slidable arm in a direction perpendicular to the outer surface of said cylinder brings a die located thereon into contact with said die adjuster, and wherein said die adjuster positions such die at a known spatial relationship with said slidable arm.

4. The apparatus of claim 2, wherein said die holding means comprises a low pressure region formed within said slidable arm, whereby dice are held in position on said slidable arm by atmospheric pressure.

5. The apparatus of claim 2, wherein said die releasing means comprises a striker positioned above said dice holder, wherein said striker contains a plurality of pins, and wherein movement of said striker against an upper surface of said dice holder causes the pins to press on a die and release it from the adhesive attachment.

* * * * *